(12) United States Patent
Kim et al.

(10) Patent No.: US 10,236,194 B2
(45) Date of Patent: Mar. 19, 2019

(54) SUPPORTING UNIT AND SUBSTRATE TREATMENT APPARATUS

(71) Applicant: Semes Co., Ltd., Cheonan-si, Chungcheongnam-do (KR)

(72) Inventors: Hyung Joon Kim, Pyeongtaek-si (KR); Seung Kue Kim, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 738 days.

(21) Appl. No.: 14/264,410

(22) Filed: Apr. 29, 2014

(65) Prior Publication Data

US 2014/0319121 A1    Oct. 30, 2014

(30) Foreign Application Priority Data

Apr. 30, 2013 (KR) .................. 10-2013-0048458
Oct. 16, 2013 (KR) .................. 10-2013-0123464

(51) Int. Cl.
*H05B 3/68* (2006.01)
*C23C 16/00* (2006.01)
*C23F 1/00* (2006.01)
*H01L 21/67* (2006.01)

(52) U.S. Cl.
CPC .. *H01L 21/67109* (2013.01); *H01L 21/67103* (2013.01)

(58) Field of Classification Search
CPC ............. H01L 21/67103; H01L 21/67109
USPC ...... 219/444.1, 201, 438, 443.1, 465.1, 544, 219/385, 390–393; 118/723 MW, 118/723 ME, 723 MR, 723 AN, 724; 156/345.41, 345.42, 345.36, 345.37; 315/111.21; 261/234; 428/332, 698; 392/416, 418
See application file for complete search history.

(56) References Cited

U.S. PATENT DOCUMENTS

| | | | | |
|---|---|---|---|---|
| 6,150,636 A | * | 11/2000 | Bogdanski | A47J 27/002 219/443.1 |
| 2005/0173410 A1 | * | 8/2005 | Okajima | H05B 3/143 219/538 |
| 2006/0011611 A1 | | 1/2006 | Goto et al. | |

(Continued)

FOREIGN PATENT DOCUMENTS

| | | |
|---|---|---|
| CN | 101740450 A | 6/2010 |
| CN | 102183876 A | 9/2011 |

(Continued)

*Primary Examiner* — Phuong Nguyen
*Assistant Examiner* — Ket D Dang
(74) *Attorney, Agent, or Firm* — Harness, Dickey & Pierce, P.L.C.

(57) ABSTRACT

Provided is a supporting unit supporting a substrate. The supporting unit includes a body including a plurality of heating regions and disposed with the substrate on a top surface thereof and a heating unit heating the body. Herein, the heating unit includes heating lines provided in the plurality of heating regions, respectively, to control temperatures of the plurality of heating regions independently from one another, terminals provided to the body and receiving power from the outside, and connecting lines connecting the heating lines to the terminals mutually corresponding to one another. Also, the terminals are disposed in one of the plurality of heating regions in a top view.

6 Claims, 8 Drawing Sheets

(56) References Cited

U.S. PATENT DOCUMENTS

| | | | | |
|---|---|---|---|---|
| 2008/0110874 A1* | 5/2008 | Hayashi | ............... | H05B 3/143 |
| | | | | 219/444.1 |
| 2011/0073039 A1* | 3/2011 | Colvin | ............. | C23C 16/45504 |
| | | | | 118/725 |
| 2012/0091108 A1* | 4/2012 | Lin | .................... | H01L 21/6831 |
| | | | | 219/201 |
| 2013/0001213 A1* | 1/2013 | Lee | ................. | H01L 21/67103 |
| | | | | 219/385 |

FOREIGN PATENT DOCUMENTS

| | | |
|---|---|---|
| JP | 2007-088484 A | 4/2007 |
| JP | 2008-118052 A | 5/2008 |
| KR | 2003-0059046 A | 7/2003 |
| KR | 2006-0048643 A | 5/2006 |
| KR | 2013-0025144 A | 3/2013 |

\* cited by examiner

SUPPORTING UNIT AND SUBSTRATE TREATMENT APPARATUS

CROSS-REFERENCE TO RELATED APPLICATIONS

This U.S. non-provisional patent application claims priority under 35 U.S.C. § 119 of Korean Patent Application Nos. 10-2013-0048458, filed on Apr. 30, 2013, and 10-2013-0123464, filed on Oct. 16, 2013, the entire contents of which are hereby incorporated by reference

BACKGROUND OF THE INVENTION

The present invention disclosed herein relates to a supporting unit and a substrate treatment apparatus, and more particularly, to a supporting unit and a substrate treatment apparatus using plasma.

To manufacture a semiconductor device, various processes such as photolithography, etching, ashing, ion injection, thin film vapor deposition, and cleaning are performed on a substrate to form a desired pattern on the substrate. Among them, an etching process is a process for removing a selected heated region of a film formed on a substrate and includes wet etching and dry etching.

To perform the dry etching, an etching apparatus using plasma is used. Generally, to form plasma, an electromagnetic field is formed in an inner space of a chamber and excites processing gases provided in the chamber to be in a plasma state.

Plasma indicates a state of ionized gases formed of ions, electrons, and radicals. The plasma is generated by a very high temperature, a strong electric field, or radio frequency (RF) electromagnetic fields. In a process of manufacturing a semiconductor device, an etching process is performed by using plasma. The etching process is performed due to ionic particles contained in the plasma, colliding with a substrate.

Generally, to control a temperature of the substrate during a substrate treatment process, a heating unit is provided in a supporting unit. The heating unit is provided in a substrate supporting member while being divided into a plurality of heating regions, thereby controlling a temperature for each heated region of the substrate. When the heating unit is provided as a plurality thereof for each heating region, since it is necessary to provide power to the plurality of heating units, respectively, there are provided a plurality of terminals connected to an external power source. Herein, the respective terminals are formed on positions corresponding to the respective heated regions of the substrate. FIG. 1 is a general electrostatic chuck 1250. Referring to FIG. 1, a central portion and an edge portion include a pair of terminals 1251 and 1252*a*, respectively. A heated region A provided with the terminals 1251*a* and 1252*a* is provided with a higher temperature than a heated region B not provided with the terminals 1251*a* and 1252*a*. Accordingly, it is difficult to uniformly control temperatures of the heated regions A and B. Due thereto, a temperature of the substrate may not be controlled to be a preset temperature.

SUMMARY OF THE INVENTION

The present invention provides a substrate treatment apparatus including a supporting unit, capable of precisely controlling a temperature of a substrate during a substrate treatment process.

Effects of the present invention are not limited to the described above, and effects not mentioned above will be clearly understood by a person of ordinary skill in the art from the specification and the attached drawings.

Embodiments of the present invention provide supporting units supporting a substrate, including a body including a plurality of heating regions and disposed with the substrate on a top surface thereof and a heating unit heating the body. Herein, the heating unit includes heating lines provided in the plurality of heating regions, respectively, to control temperatures of the plurality of heating regions independently from one another, terminals provided to the body and receiving power from the outside, and connecting lines connecting the heating lines to the terminals mutually corresponding to one another. Also, the terminals are disposed in one of the plurality of heating regions in a top view.

In some embodiments, the plurality of heating regions may include a central portion and a plurality of edge portions surrounding the central portion, and the terminals may be disposed in the central portion.

In other embodiments, the plurality of heating regions may include a central portion and one edge portion surrounding the central portion, and the terminals may be disposed in the central portion.

In still other embodiments, the plurality of heating regions may include a central portion and one or a plurality of edge portions surrounding the central portion, and the terminals may be disposed in the central portion.

In even other embodiments, the connecting lines may be provided to the body.

In yet other embodiments, the body may further include a cooling flow channel for cooling down the body.

In further embodiments, the plurality of terminals may be provided to be overlapped with the cooling flow channel in a top view.

In other embodiments of the present invention, substrate treatment apparatuses include a chamber formed with an inner space, a supporting unit located in the chamber and supporting a substrate, a gas supply unit supplying a processing gas into the chamber, and a plasma source unit generating plasma from the processing gas. Herein the supporting unit includes a body including a plurality of heating regions and disposed with the substrate on a top surface thereof and a heating unit heating the body. Also, the heating unit includes heating lines provided in the plurality of heating regions, respectively, to control temperatures of the plurality of heating regions independently from one another, terminals provided to the body and receiving power from the outside, and connecting lines connecting the heating lines to the terminals mutually corresponding to one another. Also, the terminals are disposed in one of the plurality of heating regions in a top view.

In some embodiments, the plurality of heating regions may include a central portion and a plurality of edge portions surrounding the central portion, and the terminals may be disposed in the central portion.

In other embodiments, the plurality of heating regions may include a central portion and one edge portion surrounding the central portion, and the terminals may be disposed in the central portion.

In still other embodiments, the plurality of heating regions may include a central portion and one or a plurality of edge portions surrounding the central portion, and the terminals may be disposed in the central portion.

In even other embodiments, the connecting lines may be provided to the body.

In yet other embodiments, the body may further include a cooling flow channel for cooling down the body.

In further embodiments, the plurality of terminals may be provided to be overlapped with the cooling flow channel in a top view.

In still other embodiments of the present invention, supporting units include a ceramic puck including an electrode fixing a substrate using an electrostatic force and a heating line heating the substrate, a cooling plate disposed on a bottom of the ceramic puck and including a cooling flow channel for cooling down the substrate, and a bonding layer provided between the ceramic puck and the cooling plate and bonding the ceramic puck to the cooling plate, in which the ceramic puck includes a plurality of heating regions and terminals connected to the heating lines and receiving power from the outside are disposed in one of the plurality of heating regions.

In some embodiments, the plurality of heating regions may include a central portion and a plurality of edge portions surrounding the central portion, and the terminals may be disposed in the central portion.

In other embodiments, the plurality of heating regions may include a central portion and one edge portion surrounding the central portion, and the terminals may be disposed in the central portion.

In still other embodiments, the plurality of heating regions may include a central portion and one or a plurality of edge portions surrounding the central portion, and the terminals may be disposed in the central portion.

In even other embodiments, the supporting unit may further include connecting lines connecting the heating lines to the terminals mutually corresponding to one another.

In further embodiments, the plurality of terminals may be provided to be overlapped with the cooling flow channel in a top view.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
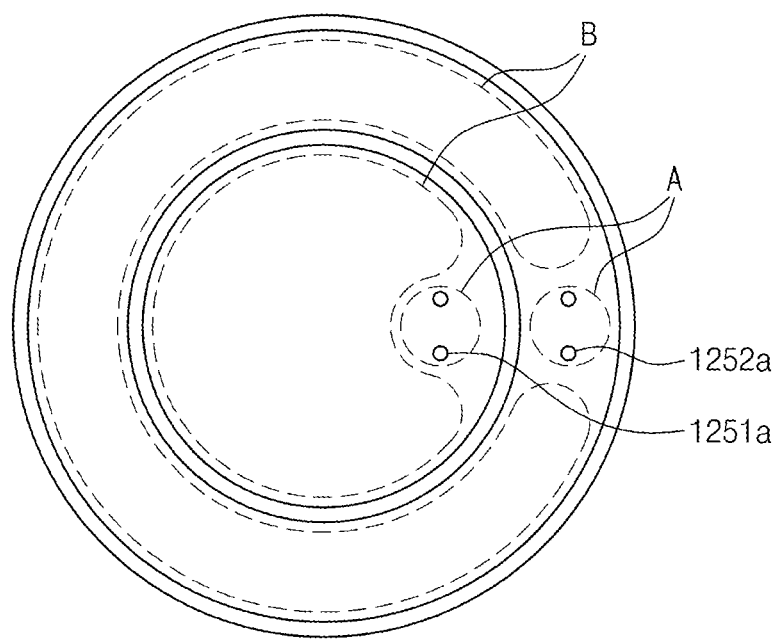
FIG. 1 is a general electrostatic chuck.

Embodiments of the present invention may be modified to be various forms, and the scope of the present invention will not be limited to the following embodiments. The embodiments are provided to more perfectly explain the present invention to a person of ordinary skill in the art. Accordingly, in the drawings, shapes and the like of elements are exaggerated for a more clear description.

The embodiments provide a substrate treatment apparatus for etching a substrate using plasma. However, not limited thereto, the embodiments will be applied to various kinds of apparatus for heating a substrate disposed thereon.

Also, in the embodiment, as a supporting unit, an electrostatic chuck will be described as an example. However, not limited thereto, the supporting unit may support a substrate through mechanical clamping or through a vacuum.

Figure 2:
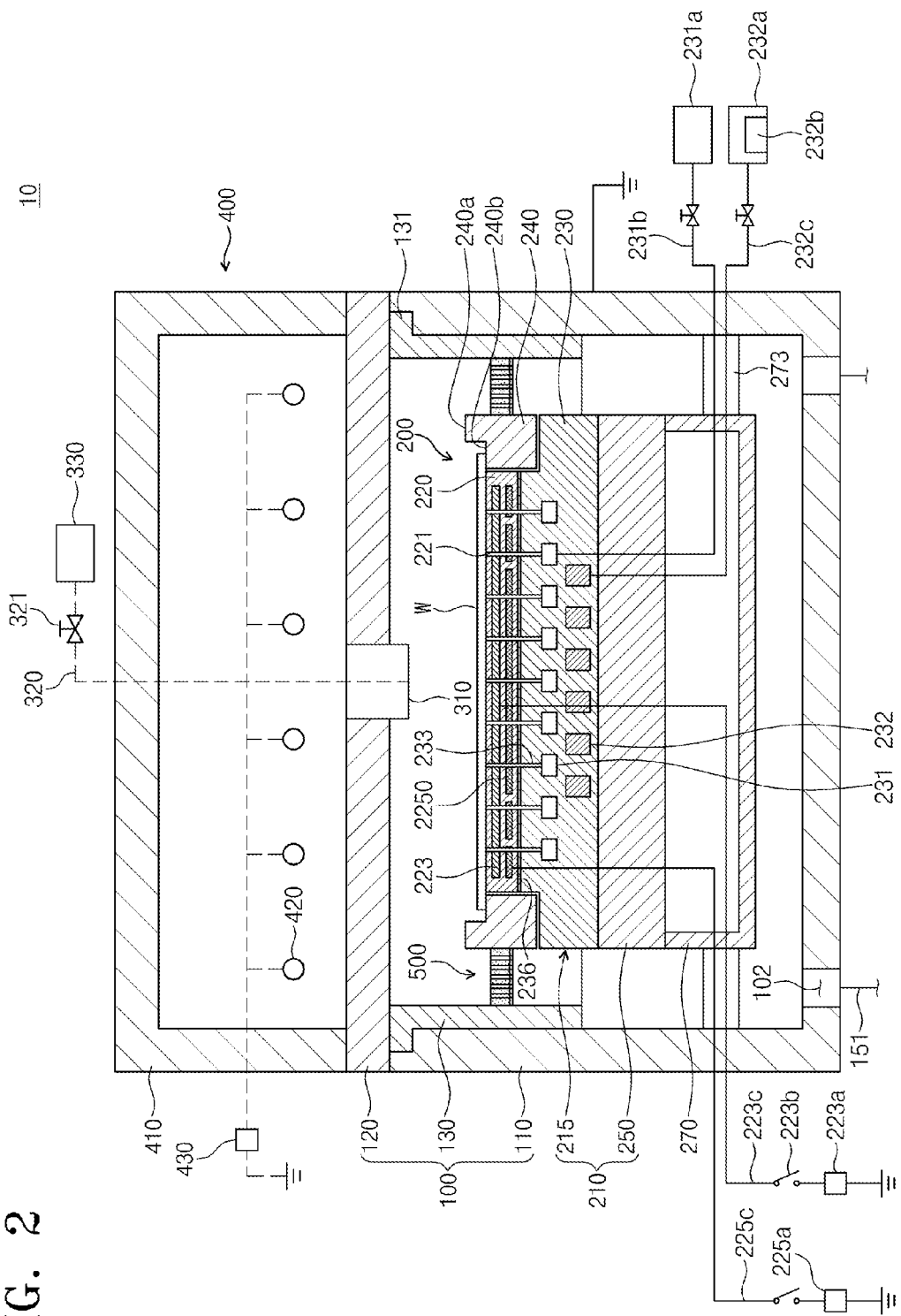
FIG. 2 is a cross-sectional view illustrating a substrate treatment apparatus according to an embodiment of the present invention.

FIG. 2 is a cross-sectional view illustrating a substrate treatment apparatus 10 according to an embodiment of the present invention.

Referring to FIG. 2, the substrate treatment apparatus 10 treats a substrate W using plasma. For example, the substrate treatment apparatus 10 may perform an etching process on the substrate W. The substrate treatment apparatus 10 includes a chamber 100, a supporting unit 200, a gas supply unit 300, a plasma source 400, and an exhaust unit 500.

The chamber 100 provides a space for performing a substrate treatment process. The chamber 100 includes a housing 110, a cover 120, and a liner 130.

The housing 110 has a space with an open top therein. The inner space of the housing 110 is provided to perform the substrate treatment process. The housing 110 is formed of a metal material. The housing 110 may be formed of aluminum. The housing 110 may be grounded. An exhaust hole 102 is formed in a bottom surface of the housing 110. The exhaust hole 102 is connected to an exhaust line 151. By-products generated in the treatment process and gases remaining in the inner space of the housing 100 may be discharged outward through the exhaust line 151. The inside of the housing 110 is depressurized to a certain degree of pressure by an exhaust process.

The cover 120 covers the open top of the housing 110. The cover 120 has a plate shape and seals the inner space of the housing 110. The cover 120 may include a dielectric window.

The liner 130 is provided inside the housing 110. The liner 130 has an inner space with open top and bottom. The liner 130 may have a cylindrical shape. The liner 130 may have a radius corresponding to an inner surface of the housing 110. The liner 130 is provided along the inner surface of the housing 110. A supporting ring 131 is formed on a top end of the liner 130. The supporting ring 131 is a ring-shaped plate and extended outwards from the liner 130 along a circumference of the liner 130. The supporting ring 131 is disposed on a top end of the housing 110 and supports the liner 130. The liner 130 may be formed of the same material as the housing 110. The liner 130 may be formed of aluminum. The liner 130 protects the inner surface of the housing 110. Arc discharges may occur in the chamber 100 while processing gases are being excited. The arc discharges damage peripheral devices. The liner 130 protects the inner surface of the housing 110 and prevents damages in the inner surface of the housing 110 caused by the arc discharges. Also, it is prevented that impurities generated during the substrate treatment process are vapor-deposited on an inner wall of the housing 110. The liner 130 is less on cost and easier to be replaced than the housing 110. Accordingly, when the liner 130 is damaged by the arc discharges, a worker may replace the damaged liner 130 with a new one.

The supporting unit 200 is located in the housing 110. The supporting unit 200 supports the substrate W. The supporting unit 200 may include an electrostatic chuck 210 adsorbing the substrate W using an electrostatic force. Hereinafter, the supporting unit 200 including the electrostatic chuck 210 will be described.

The supporting unit 200 includes the electrostatic chuck 210 and a lower cover 270. The supporting unit 200 may be spaced upwards from the bottom surface of the housing 110 in the chamber 100.

The electrostatic chuck 210 includes a body 215 and an insulating plate 250. The body 215 includes a ceramic puck 220, an electrode 223, the heating unit 2250, a supporting plate 230, and a bonding layer 236.

Referring to FIG. 2, the ceramic puck 220 is provided on a top end of the electrostatic chuck 210. As an example, the ceramic puck 220 may include a dielectric substance having a disc shape. The substrate W is disposed on a top surface of the ceramic puck 220. The top surface of the ceramic puck 220 has a radius smaller than the substrate W. Accordingly, an edge heated region of the substrate W is located outside the ceramic puck 220. The ceramic puck 220 is provided with a first supply flow channel 221. The first supply flow channel 221 is formed as a plurality thereof spaced from one another and is provided as a path for supplying a heat transfer medium to a bottom surface of the substrate W.

Figure 3:
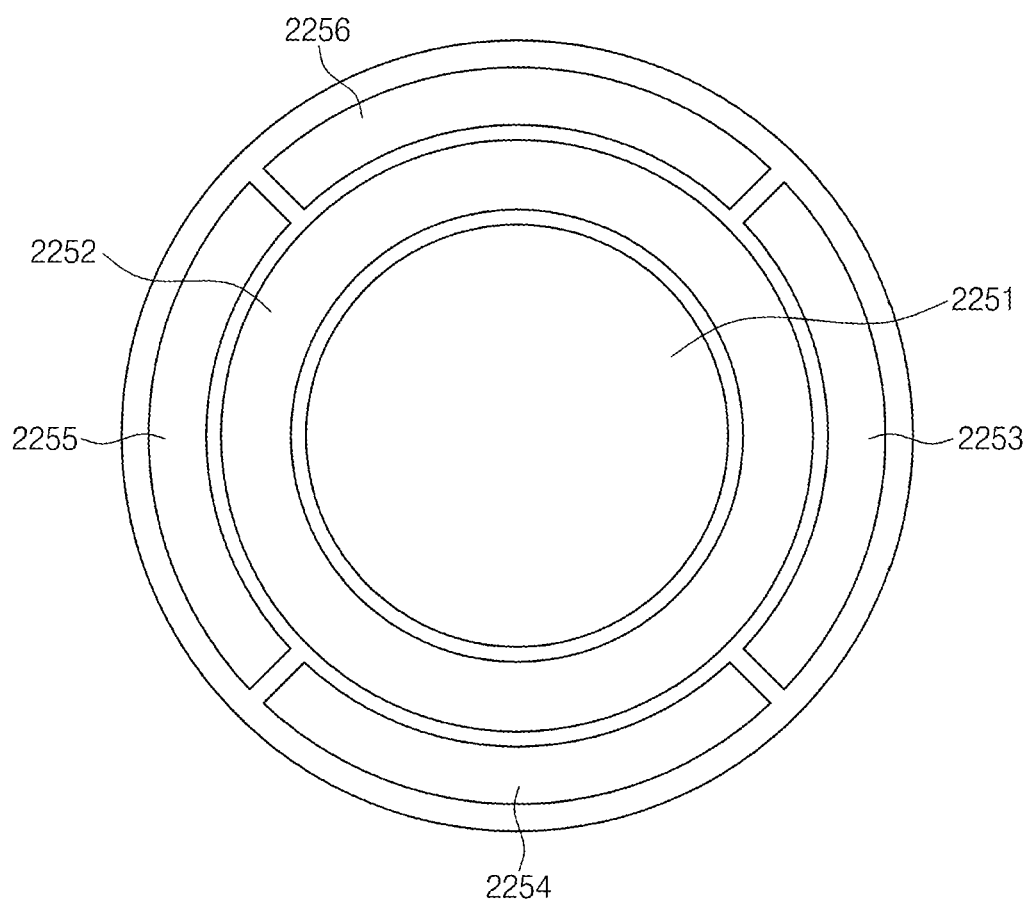
FIG. 3 is a top view of a body divided into a plurality of heating regions.

FIG. 3 is a top view of the body 215 including a plurality of heating regions. The ceramic puck 220 may have a plurality of heating regions. The plurality of heating regions include a central portion and an edge portion. The central portion is located in a center of the ceramic puck 220. The edge portion is provided to surround the central portion. The edge portion may be provided as one or a plurality thereof. Referring to FIG. 3, the ceramic puck 220 is divided into six heating regions and includes one central portion and five edge portions. Differently, the edge portion may be provided as one or a plurality thereof.

The electrode 223 is buried in the ceramic puck 220. The electrode 223 is located on a top of the heating unit 2250. The electrode 223 is electrically connected to a first lower power supply 223a. The first lower power source 223a includes a direct current (DC) power source. A switch 223b is installed between the electrode 223 and the first lower power supply 223a. The electrode 223 may be electrically connected to the first lower power supply 223a depending on on/off operation of the switch 223b. When the switch 223b is turned on, a direct current is applied to the electrode 223. An electrostatic force acts between the electrode 223 and the substrate W due to the current applied to the electrode 223. The substrate W is adsorbed onto the ceramic puck 220 due to the electrostatic force.

Figure 4:
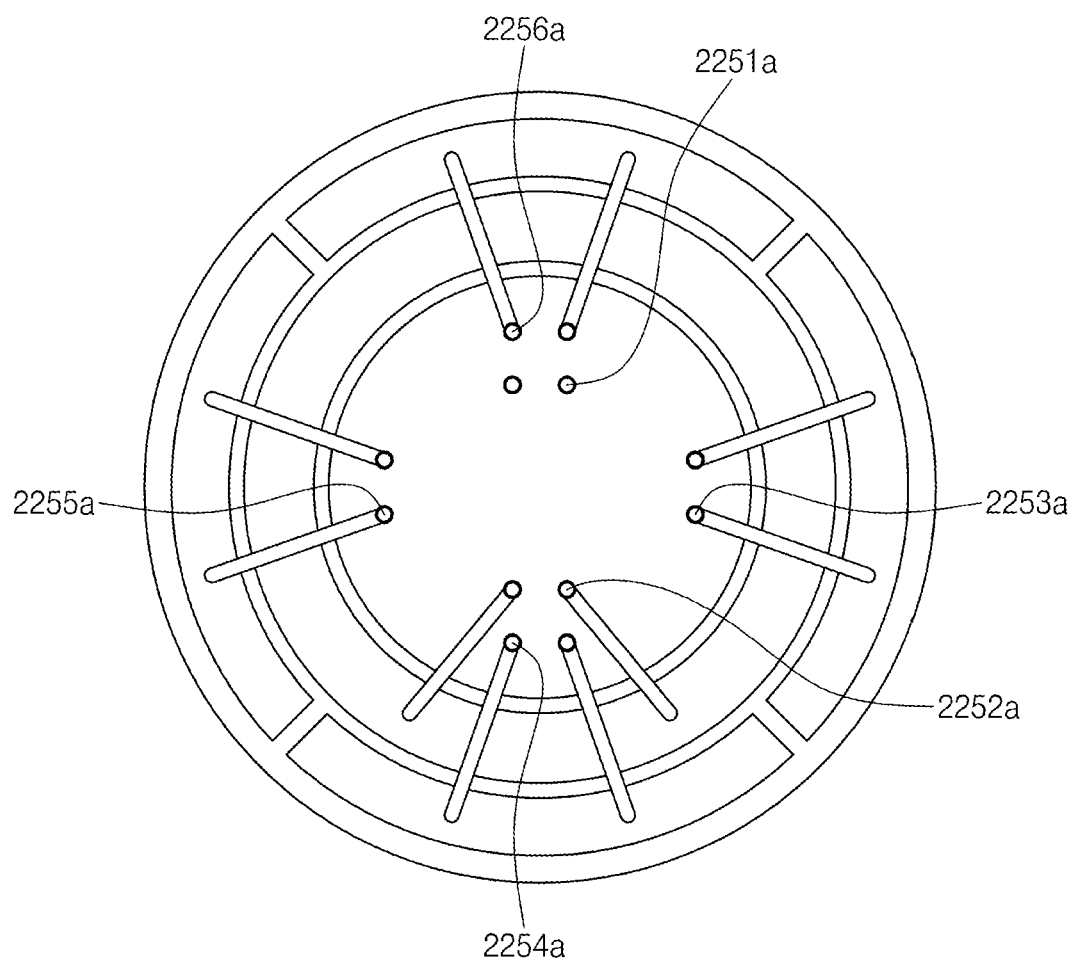
FIG. 4 is a rear view of the body of FIG. 3, including a heating unit.
Figure 5:
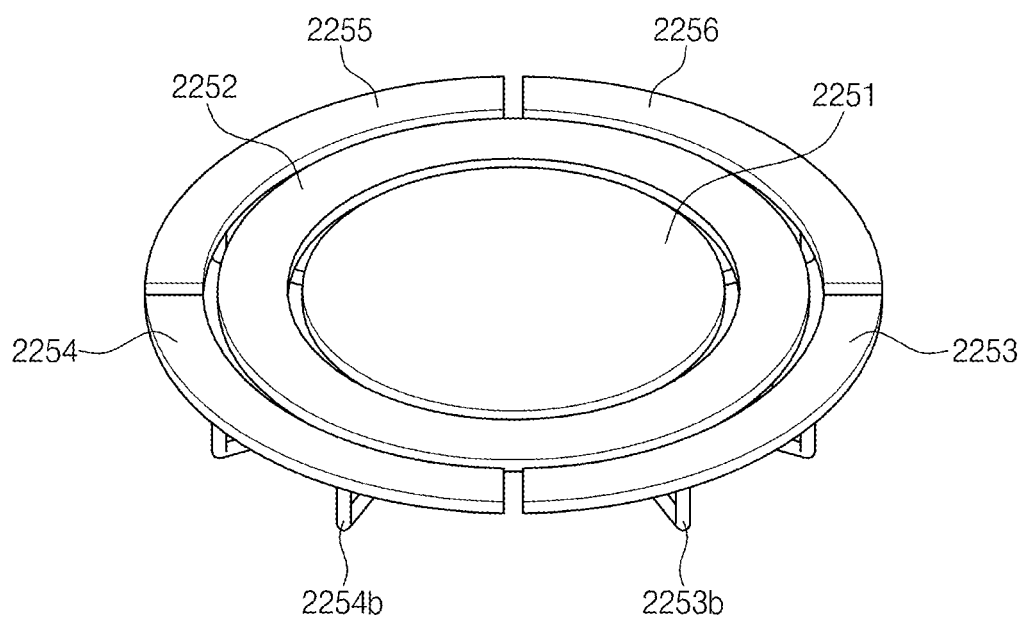
FIG. 5 is a side view of the body of FIG. 4.
Figure 6:
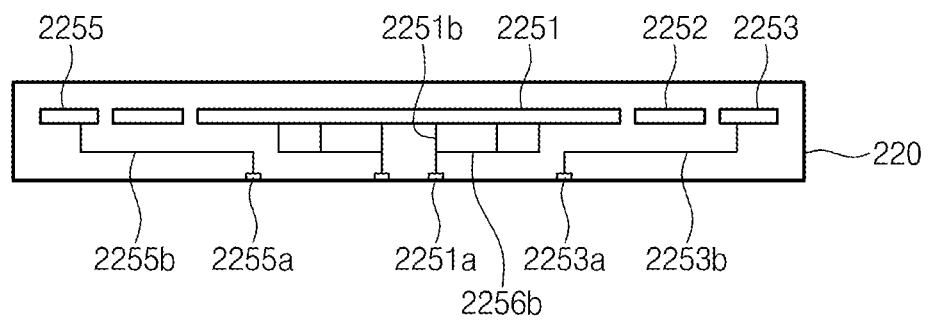
FIG. 6 is a view of an inside of a ceramic puck.

FIG. 4 is a rear view of the body of FIG. 3 including the heating unit 2250. FIG. 5 is a side view of the body of FIG. 4. FIG. 6 is a view of the inside of the ceramic puck 220.

The heating unit 2250 heats the body 215. The heating unit 2250 includes heating lines 2251 to 2256, terminals 2251a to 2256a, connecting lines 2251b to 2256b, power lines 2251c to 2256c, and a second lower power supply 225a.

The heating lines 2251 to 2256 may be provided as a plurality thereof. The heating lines 2251 to 2256 may be provided corresponding to respective heating regions. Referring to FIG. 4, the heating lines 2251 to 2256 are provided in six heating regions. The heating lines 2251 to 2256 are provided as a plurality thereof to control temperatures of a plurality of heating regions independently from one another. The heating lines 2251 to 2256 are electrically connected to the second lower power supply 225a. As an example, the heating lines 2251 to 2256 are provided as heating wires. Differently, the heating lines 2251 to 2256 may be formed through patterning. The heating lines 2251 to 2256 resist currents applied from the second lower power supply 225a, thereby generating heat. The generated heat is transferred to the substrate W through the ceramic puck 220. The substrate W is maintained at a certain temperature due to the heat generated by the heating lines 2251 to 2256. The heating lines 2251 to 2256 may be provided as coils having a spiral shape or a zigzag shape. The respective heating lines 2251 to 2256 may be applied with different power.

The terminals 2251a to 2256a are provided to the body 215. As an example, as shown in FIG. 6, the terminals 2251a to 2256a may be located on a boundary portion between the ceramic puck 220 and the supporting plate 230. The terminals 2251 to 2256a receive power from the outside. Referring to FIG. 3, in a top view, the terminals 2251a to 2256a may be provided in one of the plurality of heating regions of the ceramic puck 220. When the terminals 2251a to 2256a are provided only in one heating region, heat generated while transferring power to the terminals 2251a to 2256a is concentrated on the one heating region. In this case, considering the heat generated due to the terminals 2251a to 2256a, a temperature may be more precisely controlled for each heating region. The terminals 2251a to 2256a are provided in the one heating region in such a way that there is no increase in temperature due to the terminals 2251a to 2256a in other regions and a region provided with the terminals 2251a to 2256a is easily controlled in temperature because of the plurality of terminals 2251a to 2256a. Herein, the terminals 2251a to 2256a may be symmetrically provided in the one heating region. As an example, the terminals 2251a to 2256a may be provided in a central portion among the plurality of heating regions. Referring to FIG. 4, the terminals 2251a to 2256a are provided in the central portion among the six heating regions. Differently, the terminals 2251a to 2256a may be provided in one heating region of the edge portion of the ceramic puck 220. Selectively, the terminals 2251a to 2256a may be provided in some heating regions among the central portion and the edge portions.

The connecting lines 2251b to 2256b connect the heating lines 2251 to 2256 to the terminals 2251a to 2256a. The connecting lines 2251b to 2256b connect the heating lines 2251 to 2256 to the terminals 2251a to 2256a mutually corresponding to one another. The connecting lines 2251b to 2256b receive power through the terminals 2251a to 2256a. The connecting lines 2251b to 2256b provide power to be transferred to the heating lines 2251 to 2256.

The power lines 2251c to 2256c connect the terminals 2251a to 2256a to the second lower power supply 225a. Through the power lines 2251c to 2256c, power applied to the second lower power supply 225a is supplied to the terminals 2251a to 2256a.

Figure 7:
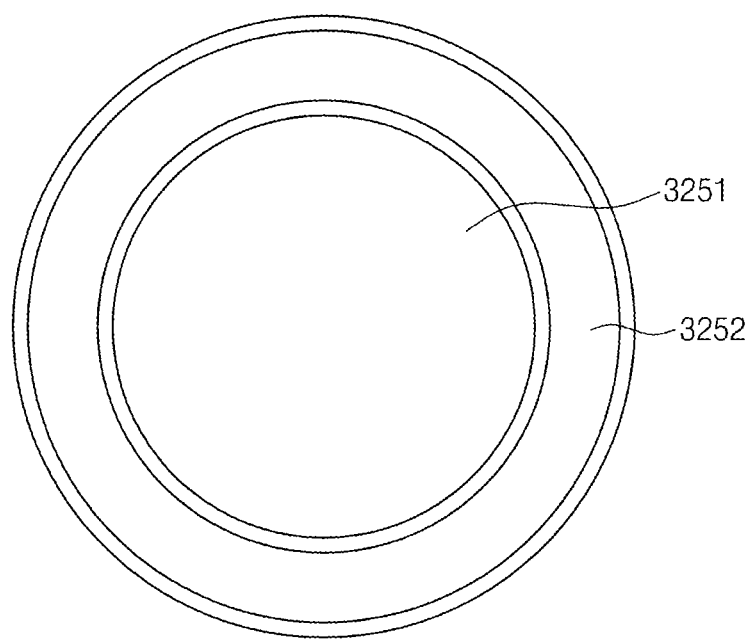
FIGS. 7 and 8 are views of a supporting unit according to another embodiment.
Figure 8:
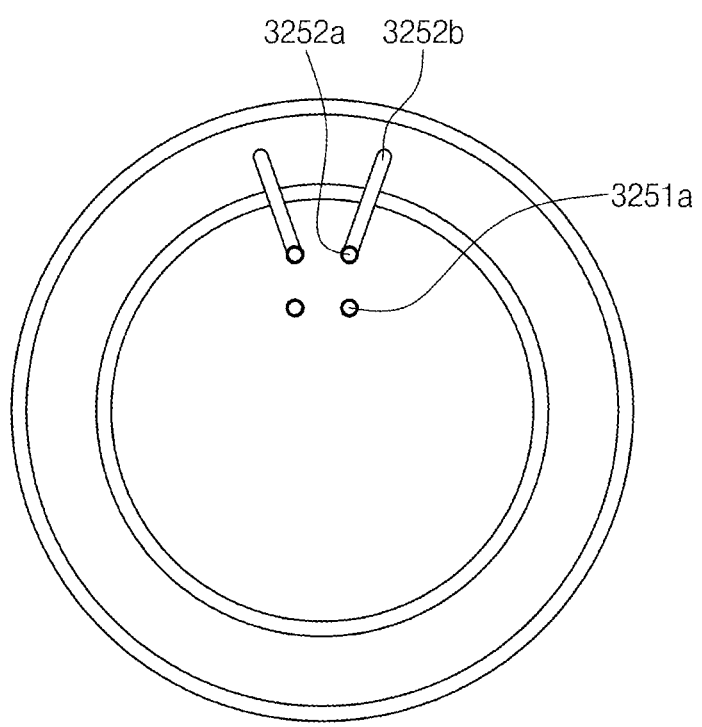

FIGS. 7 and 8 are views of a supporting unit according to another embodiment. The supporting unit has approximately similar shape and function as the supporting unit 200 of FIG. 3. Merely, a ceramic puck 320 includes a central portion and one edge portion. Accordingly, heating lines 3251 and 3252 of a heating unit 3250 are provided in the central portion and the edge portion, respectively. Referring to FIG. 8, terminals 3251a and 3252a are provided in the central portion.

Referring to FIG. 2, the supporting plate 230 is located below the ceramic puck 220. A bottom surface of the ceramic puck 220 and a top surface of the supporting plate 230 may be bonded by the bonding layer 236. The supporting plate 230 may be formed of aluminum. The supporting plate 230 may include an electrode. The top surface of the supporting plate 230 may have a step to allow a central heating portion to be located higher than an edge heating portion. The central heating portion of the top surface of the supporting plate 230 has an area corresponding to the bottom surface of the ceramic puck 220 and is bonded to the bottom surface of the ceramic puck 220. The supporting plate 230 is formed with a circulation flow channel 231, a cooling flow channel 232, and a second supply flow channel 233.

The circulation flow channel 231 is provided as a path for allowing a heat transfer medium to circulate. The circulation flow channel 231 may be formed as a spiral shape in the supporting plate 230. Alternatively, the circulation flow channel 231 may be disposed to allow flow channels having ring shapes with mutually different radiuses to have the same center. The respective circulation flow channels 231 may be connected to one another. The circulation flow channels 231 are formed to be flush with one another.

Figure 9:
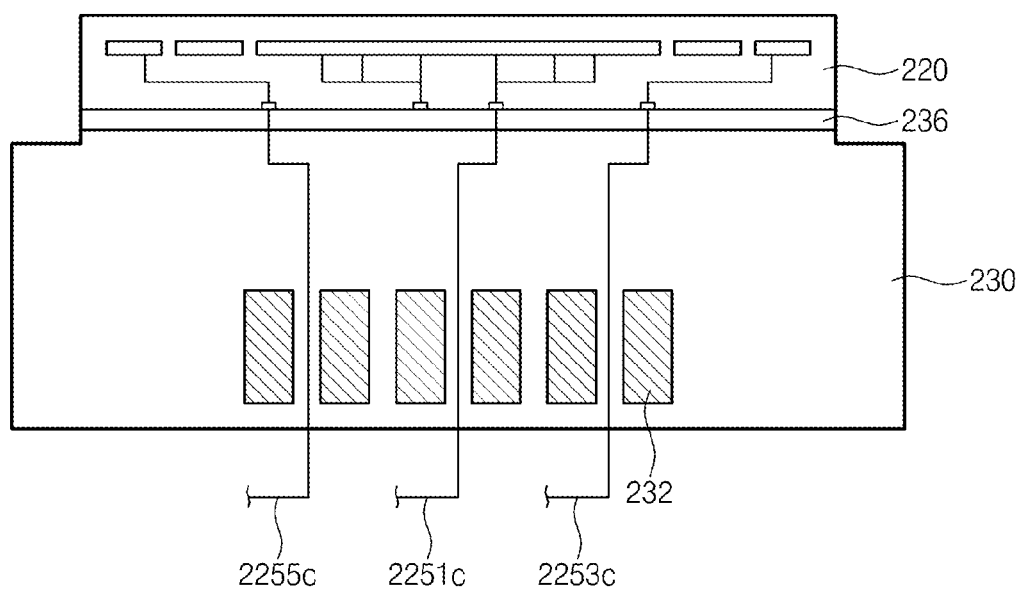
FIG. 9 is a cooling flow channel.

FIG. 9 is a view of the cooling flow channel 232. The cooling flow channel 232 cools down the body. The cooling flow channel 232 is provided as a path for allowing a cooling fluid to circulate. The cooling flow channel 232 may be formed as a spiral shape in the supporting plate 230. Also, the cooling flow channel 232 may be disposed to allow flow channels having ring shapes with mutually different radiuses to have the same center. The respective cooling flow channels 232 may be connected to one another. The cooling flow channel 232 may have a larger cross-sectional area than the circulation flow channel 231. The cooling flow channels 232 are formed to be flush with one another. The cooling flow channel 232 may be located below the circulation flow channel 231. Referring to FIG. 9, in a top view, the cooling flow channel 232 is provided to be overlapped with the terminals 2251a to 2256a. Due thereto, the cooling flow channel 232 may prevent an increase in temperature of the heating regions provided with the terminals 2251a to 2256a.

The second supply flow channel 233 is extended upwards from the circulation flow channel 231 and is provided to the top surface of the supporting plate 230. The second supply flow channel 233 is provided as a number corresponding to a number of the first supply flow channels 221.

The first circulation flow channel 231 is connected to a heat transfer medium storage 231a through a heat transfer medium supply line 231b. The heat transfer medium storage 231a stores the heat transfer medium. The heat transfer medium includes inert gases. According to embodiment, the heat transfer medium includes helium gas. The helium gas is supplied to the first circulation flow channel 231 through the heat transfer medium supply line 231b, sequentially passes through the second supply flow channel 233 and the first supply flow channel 221, and is supplied to the bottom surface of the substrate W. The helium gas functions as a medium for allowing heat transferred from the plasma to the substrate W to be transferred to the electrostatic chuck 210.

The cooling flow channel 232 is connected to a cooling fluid storage 232a through a cooling fluid supply line 232c. The cooling fluid storage 232a stores the cooling fluid. The cooling fluid storage 232a may include a cooler 232b provided therein. The cooler 232b cools down the cooling fluid to a certain temperature. Differently, the cooler 232b may be installed on the cooling fluid supply line 232c. The cooling fluid supplied to the cooling flow channel 232 through the cooling fluid supply line 232c circulates the cooling flow channel 232 and cools down the supporting plate 230. The supporting plate 230 cools down the dielectric plate 220 and the substrate W together while being cooled down, thereby maintaining the substrate W at a certain temperature.

A focus ring 240 is disposed in the edge heating portion of the electrostatic chuck 210. The focus ring 240 has a ring shape and is disposed along a circumference of the ceramic puck 220. A top surface of the focus ring 240 may have a step to allow an outer portion 240a to be higher than an inner portion 240b. The inner portion 240b of the top surface of the focus ring 240 is flush with the top surface of the ceramic puck 220. The inner portion 240b of the top surface of the focus ring 240 supports an edge heated portion of the substrate W located outside the ceramic puck 220. The outer portion 240a of the focus ring 240 may be provided to surround the edge heated portion of the substrate W. The focus ring 240, in the chamber 100, allows plasma to be converged on a heating region opposite to the substrate W.

The insulating plate 250 is located on a bottom of the supporting plate 230. The insulating plate 250 has a cross-sectional area corresponding to the supporting plate 230. The insulating plate 250 is located between the supporting plate 230 and the lower cover 270. The insulating plate 250 is formed of an insulating material and electrically insulates the supporting plate 230 from the lower cover 270.

The lower cover 270 is located on a bottom end of the supporting unit 200. The lower cover 270 is located to be spaced upwards from the bottom surface of the housing 110. A space with an open top is formed in the lower cover 270 therein. A top surface of the lower cover 270 is covered with the insulating plate 250. Accordingly, an outer radius of a cross section of the lower cover 270 may have the same length as an outer radius of the insulating plate 250. In the space in the lower cover 270, a lift pin module (not shown) for transferring the substrate W an external transfer member to the electrostatic chuck 210 may be located.

The lower cover 270 includes a connection member 273. The connection member 273 connects an outer surface of the lower cover 270 to the inner wall of the housing 110. The connection member 273 may be provided as a plurality thereof on an outer surface of the lower cover 270 with certain intervals. The connection member 273 supports the supporting unit 200 in the chamber 100. Also, the connection member 273 is connected to the inner wall of the housing 110, thereby allowing the lower cover 270 to be electrically grounded. A first power line 223c connected to the first lower power supply 223a, a second power line 225c connected to the second lower power supply 225a, the heat transfer medium supply line 231b connected to the heat transfer medium storage 231a, and the cooling fluid supply line 232c connected to the cooling fluid storage 232a are extended in the lower cover 270 through an inner space of the connection member 273.

The gas supply unit 300 supplies a processing gas into the chamber 100. The gas supply unit 300 includes a gas supply nozzle 310, a gas supply line 320, and a gas storage 330. The gas supply nozzle 310 is installed in a central portion of cover 120. An injection hole is formed in a bottom surface of the gas supply nozzle 310. The injection hole is located on a bottom of the cover and supplies the processing gas into the chamber 100. The gas supply line 320 connects the gas supply nozzle 310 to the gas storage 330. The gas supply line 320 supplies the processing gas stored in the gas storage 330 to the gas supply nozzle 310. A valve 321 is installed on the gas supply line 320. The valve 321 opens and closes the gas supply line 320 and controls a flow of the processing gas supplied through the gas supply line 320.

The plasma source 400 excites the processing gas in the chamber to be in a plasma state. As the plasma source 400, an inductively coupled plasma (ICP) source may be used. The plasma source 400 includes an antenna seal 410, an antenna 420, and a plasma power supply 430. The antenna seal 410 has a cylindrical shape with an open bottom. The antenna seal 410 is provided with a space therein. The antenna seal 410 is provided to have a diameter corresponding to the chamber 100. A bottom end of the antenna seal 410 is provided on the cover 120 to be detachable. The antenna 420 is disposed in the antenna seal 410. The antenna 420 is provided as coils having a spiral shape rolled a plurality of times and is connected to the plasma power supply 430. The antenna 420 receives power from the plasma power supply 430. The plasma power supply 430 may be located outside the chamber 100. The antenna 420 applied with the power may form an electromagnetic field in a treatment space of the chamber 100. The processing gas is excited by the electromagnetic field to be in a plasma state.

The exhaust unit 500 is located between the inner wall of the housing 110 and the supporting unit 200. The exhaust unit 500 includes an exhaust plate 510 formed with a penetration hole 511. The exhaust plate 510 is formed as a ring shape. The exhaust plate 510 is formed with a plurality of penetration holes 511. The processing gas provided into the housing 110 passes through the penetration holes 511 of the exhaust plate 510 and is exhausted through an exhaust hole 102. The flow of the processing gas may be controlled according to shapes of the exhaust plate 510 and the penetration holes 511.

Hereinafter, a process of treating the substrate W using the substrate treatment apparatus 10 will be described.

When disposing the substrate W on the supporting unit 200, direct currents are applied from the first lower power supply 223a to the electrode 223. An electrostatic force acts between the electrode 223 and the substrate W due to the direct current applied to the electrode 223. The substrate W is adsorbed onto the electric chuck 210 due to the electrostatic force.

When the substrate W is adsorbed onto the electrostatic chuck 210, the processing gas is supplied into the housing 110 through the gas supply nozzle 310. Also, high frequency power generated by the plasma power supply 430 is applied to the inside of the housing 110 through the antenna 420. The applied high frequency power excites the processing gas remaining in the housing 110. The excited processing gas is provided to the substrate W to treat the substrate W. The excited processing gas may perform an etching process.

In the embodiment described above, the heating unit 2250 has been described being provided in the ceramic puck 220. Differently, the heating unit 2250 may be provided in the supporting plate 230. Also, in the embodiment described above, it has been described that the ceramic puck 220 and the supporting plate 230 are bonded by the bonding layer 236. Differently, the ceramic puck 220 and the supporting plate 230 may be bonded through various ways.

According to the embodiments, a substrate treatment apparatus including a supporting unit capable of precisely controlling a temperature of a substrate.

Effects of the present invention are not limited to the described above, and effects not mentioned above will be clearly understood by a person of ordinary skill in the art from the specification and the attached drawings.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A supporting unit for supporting a substrate, comprising:
   a body including a plurality of heating regions defined thereon, the body configured to receive the substrate on a top surface thereof; and
   a heater configured to heat the body, the heater including,
      heating lines in the body and corresponding to the plurality of heating regions, respectively,
      terminals at the body, the terminals configured to receive power from outside, each of the terminals corresponding to one of the plurality of heating regions in a top view, an entirety of the terminals in a single region from among the plurality of heating region, and
   connecting lines each connecting one of the heating lines to a corresponding one of the terminals,
   wherein the heating lines are configured to control temperatures of the plurality of heating regions independently from one another by the power delivered from the terminals via the connecting lines,
   the plurality of heating regions comprise a central portion and one or a plurality of edge portions surrounding the central portion,
   the terminals are in the central portion,
   the body further comprises a cooling flow channel for cooling down the body, and
   the terminals overlap with the cooling flow channel in the top view.

2. The supporting unit of claim 1, wherein the connecting lines are in the body.

3. A substrate treatment apparatus comprising:
   a chamber having an inner space;
   a supporting unit in the chamber, the supporting unit configured to support a substrate;
   a gas supplier configured to supply a processing gas into the chamber; and
   a plasma source generator configured to generate plasma from the processing gas,
   wherein the supporting unit includes,
      a body including a plurality of heating regions defined thereon, the body configured to receive the substrate on a top surface thereof; and
   a heater configured to heat the body, the heater including,
      heating lines in the body and corresponding to the plurality of heating regions, respectively,
      terminals at the body, the terminals configured to receive power from outside, each of the terminals corresponding to one of the plurality of heating regions in a top view, an entirety of the terminals in a single region from among the plurality of heating region, and
      connecting lines each connecting one of the heating lines to a corresponding one of the terminals,
   wherein the heating lines are configured to control temperatures of the plurality of heating regions independently from one another by the power delivered from the terminals via the connecting lines,
   the plurality of heating regions comprise a central portion and one or a plurality of edge portions surrounding the central portion,
   the terminals are in the central portion,
   the body further comprises a cooling flow channel for cooling down the body, and
   the terminals overlap with the cooling flow channel in the top view.

4. The apparatus of claim 3, wherein the connecting lines are in the body.

5. A supporting unit comprising:
a ceramic puck including an electrode and heating lines, the electrode configured to receive a substrate thereon using an electrostatic force, the heating lines configured to heat the substrate;
a cooling plate on a bottom of the ceramic puck, the cooling plate including a cooling flow channel for cooling down the substrate; and
a bonding layer between the ceramic puck and the cooling plate, the bonding layer bonding the ceramic puck to the cooling plate,
wherein the ceramic puck further includes,
a plurality of heating regions defined thereon,
the heating lines corresponding to the plurality of heating regions, respectively,
terminals at the ceramic puck, the terminals connected to the heating lines and configured to receive power from outside, an entirety of the terminals in a single region from among the plurality of heating regions, and
connecting lines each connecting one of the heating lines to a corresponding one of the terminals, and
wherein the heating lines are configured to control temperatures of the plurality of heating regions independently from one another by the power delivered from the terminals via the connecting lines,
the plurality of heating regions comprise a central portion and one or a plurality of edge portions surrounding the central portion,
the terminals are in the central portion, and
the terminals overlap with the cooling flow channel in a top view.

6. The supporting unit of claim 5, wherein the ceramic punk further includes connecting lines, each of which connects one of the heating lines to a corresponding one of the terminals.

* * * * *